(12) United States Patent
Myrand-Lapierre

(10) Patent No.: US 11,126,534 B2
(45) Date of Patent: Sep. 21, 2021

(54) TROUBLESHOOTING A MODEL DEFINING A DYNAMIC BEHAVIOR OF A SIMULATED INTERACTIVE OBJECT

(71) Applicant: CAE Inc., Saint-Laurent (CA)

(72) Inventor: Vincent Myrand-Lapierre, Montréal (CA)

(73) Assignee: CAE Inc., Saint-Laurent (CA)

( * ) Notice: Subject to any disclaimer, the term of this patent is extended or adjusted under 35 U.S.C. 154(b) by 559 days.

(21) Appl. No.: 15/476,934

(22) Filed: Mar. 31, 2017

(65) Prior Publication Data

US 2018/0285236 A1 Oct. 4, 2018

(51) Int. Cl.
*G06F 11/36* (2006.01)
*G06F 30/00* (2020.01)

(52) U.S. Cl.
CPC ............. *G06F 11/36* (2013.01); *G06F 30/00* (2020.01)

(58) Field of Classification Search
CPC ................................. G06F 11/36; G06F 17/50
USPC .......................................................... 703/22
See application file for complete search history.

(56) References Cited

U.S. PATENT DOCUMENTS

| 4,646,255 | A * | 2/1987 | Ebert | G09B 9/12 |
| | | | | 701/3 |
| 6,446,015 | B1 * | 9/2002 | Duke | G06G 7/26 |
| | | | | 244/75.1 |
| 7,236,914 | B1 * | 6/2007 | Zyskowski | G06F 30/20 |
| | | | | 703/8 |
| 7,349,825 | B1 * | 3/2008 | Williams | G06Q 10/06 |
| | | | | 702/182 |
| 9,251,502 | B2 * | 2/2016 | Schoonveld | G06Q 10/10 |
| 9,501,611 | B2 * | 11/2016 | Jacques | G09B 9/052 |
| 9,760,660 | B2 * | 9/2017 | Spira | G06Q 10/04 |

(Continued)

OTHER PUBLICATIONS

Adiprawita et al. ("Automated Flight Test and System Identification for Rotary Wing Small Aerial Platform Using Frequency Responses Analysis", Journal of Bionic Engineering 4 (2007) 237-244). (Year: 2007).*

(Continued)

*Primary Examiner* — Iftekhar A Khan
(74) *Attorney, Agent, or Firm* — Matthew Roy; Gowling WLG (Canada) LLP

(57) ABSTRACT

Troubleshooting a model comprising a plurality of interrelated parameters defining a dynamic behavior of a simulated interactive object in an interactive computer simulation when inputs are provided on tangible instrument(s) of an interactive computer simulation station. An expected frequency response function is obtained between each of the parameters of the model and each of the instrument(s). The expected frequency response function comprises a tolerable variability function. A frequency sweep is performed of a revised model, defining a revised dynamic behavior of the simulated interactive object, providing an actual frequency response function for the instrument(s). The revised model is determined to be different from the model by identifying discrepancy measurement(s) between the expected and the actual frequency response functions, each discrepancy measurement being centered on at least one frequency. The revised model is identified as inadequate when one or more discrepancy measurements is outside of the tolerable variability function.

17 Claims, 7 Drawing Sheets

(56) References Cited

U.S. PATENT DOCUMENTS

| | | | | |
|---|---|---|---|---|
| 2004/0050999 | A1* | 3/2004 | Hill | G05D 19/02 |
| | | | | 244/17.27 |
| 2004/0162651 | A1* | 8/2004 | Halm | G07C 5/008 |
| | | | | 701/29.4 |
| 2007/0010985 | A1* | 1/2007 | Anderson | F41G 7/006 |
| | | | | 703/22 |
| 2009/0112569 | A1* | 4/2009 | Angus | H04L 67/38 |
| | | | | 703/22 |
| 2009/0294573 | A1* | 12/2009 | Wilson | B64D 5/00 |
| | | | | 244/2 |
| 2010/0318336 | A1* | 12/2010 | Falangas | G06F 30/15 |
| | | | | 703/8 |
| 2010/0332209 | A1* | 12/2010 | Casteres | G06F 30/20 |
| | | | | 703/21 |
| 2012/0117533 | A1* | 5/2012 | Hatcherson | G06F 30/20 |
| | | | | 717/101 |
| 2013/0124177 | A1* | 5/2013 | Falangas | G06F 30/15 |
| | | | | 703/8 |
| 2014/0207429 | A1* | 7/2014 | Spira | G06F 30/20 |
| | | | | 703/2 |
| 2015/0019065 | A1* | 1/2015 | Bollapragada | B64F 5/40 |
| | | | | 701/29.1 |
| 2016/0130013 | A1* | 5/2016 | Rangan | G08G 5/0013 |
| | | | | 340/963 |
| 2016/0292306 | A1* | 10/2016 | Migneault | G06F 30/00 |
| 2017/0235859 | A1* | 8/2017 | Delisle | H04L 67/32 |
| | | | | 703/22 |
| 2017/0286571 | A1* | 10/2017 | Soucy | G06F 30/20 |
| 2018/0113796 | A1* | 4/2018 | Meyers | G06F 11/36 |
| 2018/0285492 | A1* | 10/2018 | Myrand-Lapierre | G06F 30/15 |

OTHER PUBLICATIONS

Aeroplane Flight Simulator Evaluation Handbook ("International Standards for the qualification of Aeroplane flight simulators", Royal Aeronautical Society, 2005, pp. 1-551) (Year: 2005).*

Tischleretal. ("Demonstration of Frequency-Sweep Testing Technique Using a—Bell 214ST Helicopter", NASA, 1987, pp. 1-74) (Year: 1987).*

Kumar at al. ("Rotorcraft Parameter Identification from Real Time Flight Data", Journal of Aircraft, 2008, pp. 333-341) (Year: 2008).*

Leishman et al. ("State-Space Representation of Unsteady Airfoil Behavior", AIAA Journal, 1989, pp. 836-844) (Year: 1989).*

Taha et al. ("State-space representation of the unsteady aerodynamics of flapping flight", Aerospace Science and Technology 34 (2014) 1-11) (Year: 2014).*

Sriram etal ("An optimization model for aircraft maintenance scheduling and re-assignment", Transportation Research Part A 37 (2003) 29-48) (Year: 2003).*

Raivio et al. hereafter Raivio ("A Simulation Model for Military Aircraft Maintenance and Avaiability", ESM2001 15th European Simulation Multiconference, 2001, pp. 1-5) (Year: 2001) (Year: 2001).*

* cited by examiner

TROUBLESHOOTING A MODEL DEFINING A DYNAMIC BEHAVIOR OF A SIMULATED INTERACTIVE OBJECT

TECHNICAL FIELD

The present invention relates to interactive computer simulations and, more particularly, to modeling of simulated objects in interactive computer simulations.

BACKGROUND

In an interactive computer simulation such as a flight simulator, the quality of the user's experience is related, among other things, to the plausibility of the user's interactions in the simulator and to the predictability of the results of such interactions. For instance, the behavior of an airplane needs to be plausible and sufficiently predictable in relation to simulated conditions and in relation to commands from the user in the simulator. When designing a new model or revised model for an airplane or airplane configuration, an unpredictable and implausible solution may be developed without being readily identifiable as such.

The present invention addresses this concern.

SUMMARY

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with a first set of embodiments, a first aspect of the present invention is directed to a method for continuous monitoring of a model in an interactive computer simulation station, the model comprising a plurality of interrelated parameters defining a dynamic behavior of a simulated interactive object in an interactive computer simulation when inputs are provided on one or more tangible instruments of the interactive computer simulation station. The method comprises, during a diagnostic period of time of the interactive computer simulation station, performing a frequency sweep of the model, in the interactive computer simulation station, for measuring the dynamic behavior of the simulated interactive object. The method also comprises, during the frequency sweep, causing each of the one or more tangible instruments in the interactive computer simulation station to be automatically mechanically moved in accordance with an input function defining an input range variation at a related frequency, the frequency sweep, upon completion, providing an actual frequency response function for the one or more tangible instruments defining the dynamic behavior. The method yet also comprises determining that the interactive computer simulation station requires maintenance when the dynamic behavior of the simulated interactive object, measured by the frequency sweep, is outside of a target dynamic behavior range for the simulated interactive object in the interactive computer simulation station.

Optionally, the method may further comprise determining that the interactive computer simulation station is available for maintenance activities during an inactive period of time, the diagnostic period of time being shorter or equal to the inactive period of time.

Outside of the diagnostic period of time, the method may comprise running the interactive computer simulation at the interactive computer simulation station comprising a display module and in real-time during the interactive computer simulation, monitoring the one or more tangible instruments for user inputs causing a simulated behavior of the simulated interactive object considering the model associated thereto, wherein images from the interactive computer simulation are shown on at least one display screen of the display module in relation to the simulated behavior.

The method may optionally further comprise planning the frequency sweep for completion over a plurality of disjoint diagnostic periods of time.

In some embodiments, the method further comprises defining a frequency response correlation of the model for a given one of tangible instruments, wherein the frequency response correlation provides at least one of association of a given centered frequency for the given one of tangible instruments with one or more of the plurality of parameters of the model and association of one of the plurality of parameters of the model with at least one frequency range for the given one of tangible instruments. The method may then further optionally comprise obtaining a baseline frequency response function between each of the plurality of interrelated parameters of the model and each of the one or more tangible instruments, identifying one or more discrepancy measurements between the baseline frequency response function and the actual frequency response function, each discrepancy measurement being centered on at least one frequency and identifying at least one target parameter from the plurality of interrelated parameters causing the discrepancy measurement with reference to the frequency response correlation.

The simulated interactive object may be a simulated aircraft and the plurality of interrelated parameters may then comprise a drag value, a side-force value, a lift value, a pitch value, a roll value, a yaw value and a power profile and a plurality of simulated constraints associated to the computer generated environment may include gravitational force and atmospheric pressure.

In some embodiments, the method further comprises, upon determining that the interactive computer simulation station requires maintenance, sending a repair request comprising the actual frequency response function. A successful response to the request with a repaired model may then be received followed by dynamically updating the model with the repaired model.

In accordance with the first set of embodiments, a second aspect is directed to an interactive computer simulation station, executing and interactive computer simulation, comprising an instrument module, a processor module and a mechanical instrument actuator.

The instrument module comprises one or more tangible instruments. A plurality of interrelated parameters defines a dynamic behavior of a simulated interactive object in the interactive computer simulation and inputs provided through the instrument module control the dynamic behavior of the simulated interactive object in the interactive computer simulation.

The processor module, during a diagnostic period of time of the interactive computer simulation station, performs a frequency sweep of the model, in the interactive computer simulation station, for measuring the dynamic behavior of the simulated interactive object. The mechanical instrument actuator, during the frequency sweep, causes each of the one or more tangible instruments in the interactive computer simulation station to be automatically mechanically moved in accordance with an input function defining an input range variation at a related frequency, the frequency sweep, upon completion, providing an actual frequency response function for the one or more tangible instruments defining the dynamic behavior. The processor module also determines that the interactive computer simulation station requires maintenance when the dynamic behavior of the simulated interactive object, measured by the frequency sweep, is outside of a target dynamic behavior range for the simulated interactive object in the interactive computer simulation station.

The processor module may optionally further determine that the interactive computer simulation station is available for maintenance activities during an inactive period of time, the diagnostic period of time being shorter or equal to the inactive period of time.

The interactive computer simulation station may further comprise a display module and the processor module may further, outside of the diagnostic period of time run the interactive computer simulation and, in real-time during the interactive computer simulation, monitor the one or more tangible instruments for user inputs causing a simulated behavior of the simulated interactive object considering the model associated thereto. Images from the interactive computer simulation are rendered for display on at least one display screen of the display module in relation to the simulated behavior.

The processor module may further optionally plan the frequency sweep for completion over a plurality of disjoint diagnostic periods of time.

In some embodiments, the processor module may further define a frequency response correlation of the model for a given one of tangible instruments. The frequency response correlation may provide at least one of association of a given centered frequency for the given one of tangible instruments with one or more of the plurality of parameters of the model and association of one of the plurality of parameters of the model with at least one frequency range for the given one of tangible instruments. The processor module may further obtain a baseline frequency response function between each of the plurality of interrelated parameters of the model and each of the one or more tangible instruments, identify one or more discrepancy measurements between the baseline frequency response function and the actual frequency response function, each discrepancy measurement being centered on at least one frequency and identify at least one target parameter from the plurality of interrelated parameters causing the discrepancy measurement with reference to the frequency response correlation.

The simulated interactive object may, in some embodiments, be a simulated aircraft. The plurality of interrelated parameters may then comprise a drag value, a side-force value, a lift value, a pitch value, a roll value, a yaw value and a power profile and a plurality of simulated constraints associated to the computer generated environment comprises gravitational force and atmospheric pressure.

The interactive computer simulation station may further comprise a network interface module and the processor module may further, upon determining that the interactive computer simulation station requires maintenance, send a repair request comprising the actual frequency response function through the network interface module. The interactive computer simulation station nay further receive, through the network interface module, a successful response to the request with a repaired model before dynamically updating the model with the repaired model.

In accordance with a second set of embodiments, a third aspect of the present invention is directed to a method for troubleshooting a model comprising a plurality of interrelated parameters defining a dynamic behavior of a simulated interactive object in an interactive computer simulation when inputs are provided on one or more tangible instruments of an interactive computer simulation station. The method comprises obtaining an expected frequency response function between each of the plurality of interrelated parameters of the model and each of the one or more tangible instruments, the expected frequency response function comprising a corresponding tolerable variability function, performing a frequency sweep of a revised model, defining a revised dynamic behavior of the simulated interactive object, providing an actual frequency response function for each of the one or more tangible instruments, determining that the revised model is different from the model by identifying one or more discrepancy measurements between the expected frequency response function and the actual frequency response function, each discrepancy measurement being centered on at least one frequency and identifying the revised model as inadequate when at least one of the one or more discrepancy measurements is outside of the corresponding tolerable variability function.

The method may further comprise defining a frequency response correlation of the model for a given one of tangible instruments, wherein the frequency response correlation provides at least one of an association of a given centered frequency for the given one of tangible instruments with one or more of the plurality of parameters of the model and an association of one of the plurality of parameters of the model with at least one frequency range for the given one of tangible instruments. The method may then also comprise identifying at least one target parameter from the plurality of interrelated parameters causing the discrepancy measurement with reference to the frequency response correlation.

The simulated interactive object is a simulated aircraft and the plurality of interrelated parameters may then comprise a drag value, a side-force value, a lift value, a pitch value, a roll value, a yaw value and a power profile and a plurality of simulated constraints associated to the computer generated environment may include gravitational force and atmospheric pressure.

In some embodiments, the expected frequency response function may be associated with an identifiable version of the simulated interactive object. The frequency sweep of the revised model may be performed in the context of designing the revised model for the simulated interactive object in the interactive computer simulation station.

Optionally, the frequency sweep of the revised model may be performed in the context of maintenance of the interactive computer simulation station. The method may then further comprise sending a request to repair the revised model comprising the actual frequency response function. The method may yet further comprise receiving a successful response to the request with a repaired model and dynamically updating the revised model with the repaired model.

In accordance with the second set of embodiments, a fourth aspect of the present invention is directed to a computer system for troubleshooting a model comprising a plurality of interrelated parameters defining a dynamic behavior of a simulated interactive object in an interactive computer simulation when inputs are provided on one or more tangible instruments of an interactive computer simulation station. The computer system comprises a network interface module and a processing module.

The network interface module obtains an expected frequency response function between each of the plurality of interrelated parameters of the model and each of the one or more tangible instruments, the expected frequency response function comprising a corresponding tolerable variability function;

The processing module performs a frequency sweep of a revised model, defining a revised dynamic behavior of the simulated interactive object, providing an actual frequency response function for each of the one or more tangible instruments, determines that the revised model is different from the model by identifying one or more discrepancy measurements between the expected frequency response function and the actual frequency response function, each discrepancy measurement being centered on at least one frequency and identifies the revised model as inadequate when at least one of the one or more discrepancy measurements is outside of the corresponding tolerable variability function.

The processing module may further define a frequency response correlation of the model for a given one of tangible instruments, wherein the frequency response correlation provides at least one of an association of a given centered frequency for the given one of tangible instruments with one or more of the plurality of parameters of the model an association of one of the plurality of parameters of the model with at least one frequency range for the given one of tangible instruments. The processing module may also further identify at least one target parameter from the plurality of interrelated parameters causing the discrepancy measurement with reference to the frequency response correlation.

The simulated interactive object may be a simulated aircraft and the plurality of interrelated parameters may then comprise a drag value, a side-force value, a lift value, a pitch value, a roll value, a yaw value and a power profile and a plurality of simulated constraints associated to the computer generated environment comprises gravitational force and atmospheric pressure.

The expected frequency response function may be associated with an identifiable version of the simulated interactive object.

In some embodiments, the frequency sweep of the revised model is performed in the context of designing the revised model for the simulated interactive object in the interactive computer simulation station.

In some embodiments, the frequency sweep of the revised model may be performed in the context of maintenance of the interactive computer simulation station. The network interface module may then further send a request to repair the revised model comprising the actual frequency response function. The network interface module may yet further receive a successful response to the request with a repaired model and the processing module may then dynamically update the revised model with the repaired model.

In accordance with a third set of embodiments, a fifth aspect of the present invention is directed to a method for repairing a model comprising a plurality of interrelated parameters defining a dynamic behavior of a simulated interactive object in an interactive computer simulation when inputs are provided on one or more tangible instruments of an interactive computer simulation station. The method comprises obtaining an expected frequency response function, for the simulated interactive object, between each of the plurality of interrelated parameters of the model and each of the one or more tangible instruments, identifying one or more discrepancy measurements between the expected frequency response function and an actual frequency response function obtained from a frequency sweep of the model and identifying at least one target parameter from the plurality of interrelated parameters as a potential cause of the one or more discrepancy measurements. Until at least one of i) a subsequent frequency response function from a subsequent frequency sweep matches the expected frequency response function, and ii) each of the at least one target parameter has been fully varied throughout a corresponding range, the method continues with dynamically and iteratively varying one or more of the at least one target parameter within the one or more corresponding ranges and performing the subsequent frequency sweep providing the subsequent frequency response.

In some embodiments, the expected frequency response function may comprise a corresponding tolerable variability function and the subsequent frequency sweep may be evaluated against the expected frequency response function in i) considering the tolerable variability function for determining when there is a match therebetween.

When ii) occurs, one or more of the tangible instruments may in some embodiments be identified as possibly defective.

Optionally, the method may further comprise defining a frequency response correlation of the model for a given one of the tangible instruments, wherein the frequency response correlation provides at least one of association of a given frequency for the given one tangible instrument with one or more of the plurality of parameters of the model and association of one of the plurality of parameters of the model with at least one frequency range for the given one tangible instrument. Identifying the at least one target parameter may be performed using at least one centered frequency for the discrepancy measurements in relation to the frequency response correlation.

When i) occurs, the method may further comprise selectively and dynamically updating the model associated to the simulated interactive object with a repaired model. The method may then also optionally further comprise running the interactive computer simulation at the interactive computer simulation station comprising a display module and, in real-time during the interactive computer simulation, monitoring the one or more tangible instruments for user inputs causing a simulated behavior of the simulated interactive object considering the repaired model associated thereto. Images from the interactive computer simulation are shown on at least one display screen of the display module in relation to the simulated behavior.

The simulated interactive object may be a simulated aircraft and the plurality of interrelated parameters may then comprise a drag value, a side-force value, a lift value, a pitch value, a roll value, a yaw value and a power profile and a plurality of simulated constraints associated to the computer generated environment may include gravitational force and atmospheric pressure.

In some embodiments, the method further comprises receiving a request to repair the model comprising the actual frequency response function and, upon i), dynamically updating the model into a repaired model and sending a successful response to the request. The request may comprise a model identification request and wherein the request comprises an identifiable version of the simulated interactive object. The method may also further comprise receiving the request in the context of maintenance of the interactive computer simulation station.

In accordance with the third set of embodiments, a sixth aspect of the present invention is directed to a computer system for repairing a model comprising a plurality of interrelated parameters defining a dynamic behavior of a simulated interactive object in an interactive computer simulation when inputs are provided on one or more tangible instruments of an interactive computer simulation station. The computer system comprises a network interface module and a processing module.

The network interface module obtains an expected frequency response function, for the simulated interactive object, between each of the plurality of interrelated parameters of the model and each of the one or more tangible instruments;

The processing module identifies one or more discrepancy measurements between the expected frequency response function and an actual frequency response function obtained from a frequency sweep of the model and identifies at least one target parameter from the plurality of interrelated parameters as a potential cause of the one or more discrepancy measurements. The processing module, until at least one of i) a subsequent frequency response function from a subsequent frequency sweep matches the expected frequency response function, and ii) each of the at least one target parameter has been fully varied throughout a corresponding range, also dynamically and iteratively varies one or more of the at least one target parameter within the one or more corresponding ranges and performs the subsequent frequency sweep providing the subsequent frequency response.

The expected frequency response function may comprise a corresponding tolerable variability function and the subsequent frequency sweep may then be evaluated against the expected frequency response function in i) considering the tolerable variability function for determining when there is a match therebetween.

When ii) occurs, one or more of the tangible instruments may identified as possibly defective by the processing module.

The processing module may further define a frequency response correlation of the model for a given one of the tangible instruments, wherein the frequency response correlation provides at least one of association of a given frequency for the given one tangible instrument with one or more of the plurality of parameters of the model and association of one of the plurality of parameters of the model with at least one frequency range for the given one tangible instrument. Identifying the at least one target parameter may be performed using at least one centered frequency for the discrepancy measurements in relation to the frequency response correlation.

In some embodiments, the processing module, when i) occurs, further selectively and dynamically update the model associated to the simulated interactive object with a repaired model. The processing module may further run the interactive computer simulation at the interactive computer simulation station comprising a display module and in real-time during the interactive computer simulation, may further monitor the one or more tangible instruments for user inputs causing a simulated behavior of the simulated interactive object considering the repaired model associated thereto. Images from the interactive computer simulation are shown on at least one display screen of the display module in relation to the simulated behavior.

The simulated interactive object may be a simulated aircraft and the plurality of interrelated parameters may comprise a drag value, a side-force value, a lift value, a pitch value, a roll value, a yaw value and a power profile and a plurality of simulated constraints associated to the computer generated environment may include gravitational force and atmospheric pressure.

In some embodiments, the network interface module may further receive a request to repair the model comprising the actual frequency response function and the processor module, upon i), may dynamically update the model into a repaired model and sends a successful response to the request through the network interface module. The request may comprise a model identification request and wherein the request comprises an identifiable version of the simulated interactive object. The network interface module may further receive the request in the context of maintenance of the interactive computer simulation station.

BRIEF DESCRIPTION OF THE DRAWINGS

Further features and exemplary advantages of the present invention will become apparent from the following detailed description, taken in conjunction with the appended drawings, in which.

DETAILED DESCRIPTION

Figure 1:
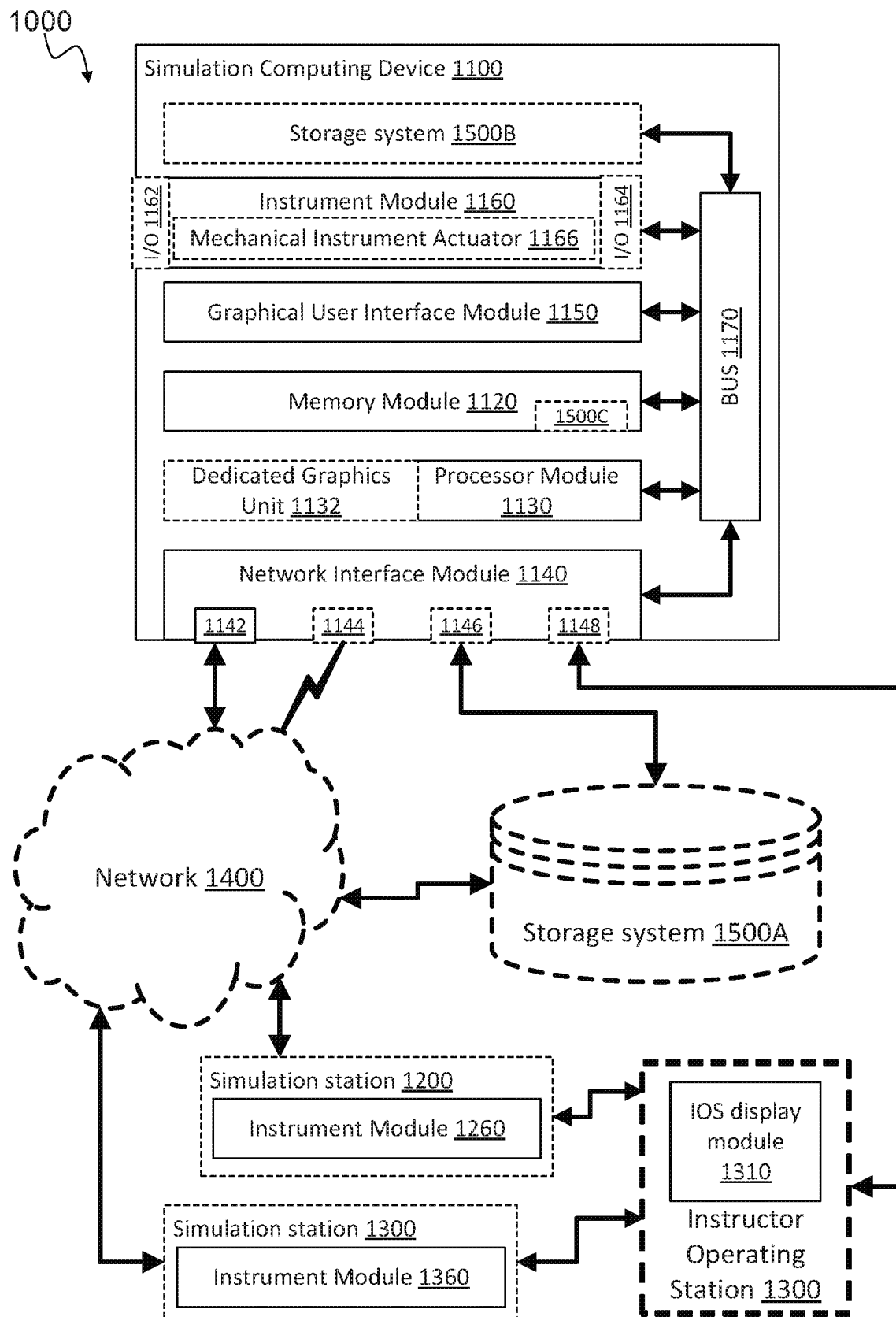
FIG. 1 is a logical modular representation of an exemplary computer system in accordance with the teachings of the present invention.

In an interactive computer simulation, a computer generated environment is provided with different structures (e.g., buildings, streets, airports, lakes, rivers, etc.) and certain sets of rules. For instance, the computer generated environment may specify a constant gravitational force value and a variable air pressure value that varies as a function of altitude in the computer generated environment. Of course, as skilled persons will readily recognize, the gravitational force value may also be set as a function of distance to one or more planets, which would be critical if the interactive computer simulation was related to space travel. Many other rules are also set in the interactive computer simulation (e.g., weather parameters, parameterized lighting conditions, etc.), which may be set to replicate a realistic environment, an expected environment or a fictitious one, depending on the context of the interactive computer simulation. The computer generated environment may also comprise other dynamic representations (e.g., simulated moving vehicles, simulated humans, etc.). The interactive computer simulation also comprises one or more simulated interactive objects controlled by at least one user of the interactive computer simulation. For instance, the simulated interactive object may be a vehicle (e.g., airplane, helicopter, spacecraft, tank, etc.), a human (e.g., a physician in a hospital), a control panel (e.g., from a nuclear central, air traffic controller station) etc. A physical instrument module is provided for the user to control the simulated interactive object in the interactive computer simulation using one or more tangible instruments. The simulated interactive object is defined by a model in the interactive computer simulation. The model sets the capacity and characteristics of the simulated interactive object in the computer generated environment. For instance, in the case of a simulated airplane, the corresponding model sets the lift force at different airspeed considering the airplane angle of attack in the air and flap position. Of course, many other parameters also define how the simulated airplane must behave in the interactive computer simulation.

The model for the interactive simulated object contains a plurality of interrelated parameters. That is, the value of a single parameter defines many aspects of the simulated behavior of the simulated object. As such, setting one value for one of the model parameters has an impact on many aspects of the simulated behavior of the interactive object in the interactive computer simulation. It is difficult to identify defective models, maintain models being used in simulators and/or repair defective models as the effect of a defective or improper parameters on the simulated behavior of the simulated object is most often not be readily identifiable.

In the context of training provided by interactive computer flight simulators stations, an accurate representation of a flying aircraft is required with the fidelity and realism to affect a positive standard of behavior in flight crews. Qualification Test Guides (QTGs) are the method currently used to ensure the device remains faithful to the original design and qualification data. However, the QTGs require the simulator stations to be taken offline for an extended period of time (e.g., 3 to 4 hours). Furthermore, even when one or more of the tests established by the QTGs fail, the faulty element of the simulator station is not necessarily identified, especially if the problem resides in the aircraft model. In situation when the model is identified as faulty, no mechanism is provided to repair the model.

While the present invention was mostly envisioned considering an alternative and/or a complement to the QTGs related to flight simulators, the teachings and findings are applicable in various situations where an interactive simulator is controlled through a model implemented in an interactive computer simulation station. The fundamental idea underlying all embodiments of the present invention is to proceed to different analysis of the frequency response of the model in an interactive computer simulator. In the context of flight simulators, it has been shown that frequency responses provide an accurate characterization of aerodynamic behavior.

In order to do this, one or more frequency responses of one or more models in an interactive computer simulation station is determined. For instance, this may be achieved by submitting one or more tangible instruments of the interactive computer simulation station to stimulation (i.e., physical movements) in accordance with a defined function (e.g., known amplitude of movement and frequency of movement). The effect of the stimulation is measured on the behavior of an interactive simulated object. Subsequently, the measured effects are transformed in the time domain into the domain of the frequency response, e.g., by using Fast Fourier Transform (FFT). It has been determined that the analysis of the measured effects through frequency analysis allows to quickly study the dynamics of the model.

For instance, in the context of aircraft modeling used on flight simulator stations, the tangible instruments of the flight simulator station may be stimulated to perform defined maneuvers at different speeds (4 flight regimes, different altitude) and along different axes (longitudinal, lateral, directional and vertical) to obtain desirable measurements.

The interactive computer simulation may, for instance, be used for training purposes and/or for enacting a scenario from historical data (e.g., from a recording of a surgical procedure, from an event recording device (e.g., black box) from an aircraft, a train, etc.). The interactive computer simulation may be scenario-based (e.g., where simulation code driving the interactive computer generated environment comprises one or more predetermined events, motions, sounds, etc.).

The interactive computer simulation may be a training simulation program such as a flight simulation software or a healthcare simulation software. The computer generated environment is related to the interactive computer simulation (e.g., a virtual representation of a real or fictional region of the world, a virtual representation of a real or fictional hospital) where the interactive computer simulation can take place (e.g., the Greater Montreal area with a detailed representation of at least some of its airports or a fully-equipped operating room from Hôpital Ste-Justine de Montréal). The interactive computer simulation may also be related to a vehicle interactive computer simulation involving one or more simulated vehicle(s). The interactive computer simulation may be a (e.g., single or multiple vehicles simultaneously). The present invention is not limited by the type of interactive simulated vehicle, which may be terrestrial (car, tank, etc.), underground, airborne (e.g., an aircraft, a space shuttle), floating (e.g., a boat), etc. The interactive computer simulation may also be related to a game, which could differ from the training simulation because of the different rules that apply in the computer generated environment (e.g., varying gravity force, presence of unrealistic elements (force fields), varying response to damages, varied capacity to undo or affect past actions, success measured on different results, etc.).

Reference is now made to the drawings in which FIG. 1 shows a logical modular representation of an exemplary interactive computer simulation system 1000 providing a model associated to a simulated interactive object of an interactive computer simulation, in accordance with the teachings of the present invention. The interactive computer simulation system 1000 comprises a simulation computing device. In some embodiments, the simulation computing device is an interactive computer simulation station, which may executing one or more interactive computer simulations such as a flight simulation software instance or a healthcare simulation software instance.

In the depicted example of FIG. 1, the simulation computing device comprises a memory module 1120, a processor module 1130 and a network interface module 1140. The processor module 1130 may represent a single processor with one or more processor cores or an array of processors, each comprising one or more processor cores. In some embodiments, the processor module 1130 may also comprise a dedicated graphics processing unit 1132. The dedicated graphics processing unit 1132 may be required, for instance, when the interactive computer simulation system 1000 performs an immersive simulation (e.g., pilot training-certified flight simulator), which requires extensive image generation capabilities (i.e., quality and throughput) to maintain expected realism of such immersive simulation (e.g., between 5 and 60 images rendered per seconds or maximum between 15 ms and 200 ms for each rendered image). In some embodiments, each of the simulation stations 1200, 1300 comprise a processor module having a dedicated graphics processing unit similar to the dedicated graphics processing unit 1132. The memory module 1120 may comprise various types of memory (different standardized or kinds of Random Access Memory (RAM) modules, memory cards, Read-Only Memory (ROM) modules, programmable ROM, etc.). The network interface module 1140 represents at least one physical interface that can be used to communicate with other network nodes. The network interface module 1140 may be made visible to the other modules of the computer system 1100 through one or more logical interfaces. The actual stacks of protocols used by the physical network interface(s) and/or logical network interface(s) 1142, 1144, 1146, 1148 of the network interface module 1140 do not affect the teachings of the present invention. The variants of processor module 1130, memory module 1120 and network interface module 1140 usable in the context of the present invention will be readily apparent to persons skilled in the art.

A bus 1170 is depicted as an example of means for exchanging data between the different modules of the computer system 1100. The present invention is not affected by the way the different modules exchange information between them. For instance, the memory module 1120 and the processor module 1130 could be connected by a parallel bus, but could also be connected by a serial connection or involve an intermediate module (not shown) without affecting the teachings of the present invention.

Likewise, even though explicit mentions of the memory module 1120 and/or the processor module 1130 are not made throughout the description of the various embodiments, persons skilled in the art will readily recognize that such modules are used in conjunction with other modules of the computer system 1100 to perform routine as well as innovative steps related to the present invention.

The simulation computing device also comprises a Graphical User Interface (GUI) module 1150 comprising one or more display screen(s). The display screens of the GUI module 1150 could be split into one or more flat panels, but could also be a single flat or curved screen visible from an expected user position (not shown) in the simulation computing device. For instance, the GUI module 1150 may comprise one or more mounted projectors for projecting images on a curved refracting screen. The curved refracting screen may be located far enough from the user of the interactive computer program to provide a collimated display. Alternatively, the curved refracting screen may provide a non-collimated display.

The interactive computer simulation system 1000 comprises a storage system 1500 that may log dynamic data in relation to the dynamic sub-systems while the interactive computer simulation is performed. FIG. 1 shows examples of the storage system 1500 as a distinct database system 1500A, a distinct module 1500B of the computer system 1110 or a sub-module 1500C of the memory module 1120 of the computer system 1110. The storage system 1500 may also comprise storage modules (not shown) on the simulation stations 1200, 1300. The storage system 1500 may be distributed over different systems A, B, C and/or the simulations stations 1200, 1300 or may be in a single system. The storage system 1500 may comprise one or more logical or physical as well as local or remote hard disk drive (HDD) (or an array thereof). The storage system 1500 may further comprise a local or remote database made accessible to the computer system 1100 by a standardized or proprietary interface or via the network interface module 1140. The variants of storage system 1500 usable in the context of the present invention will be readily apparent to persons skilled in the art.

An Instructor Operating Station (IOS) 1600 may be provided for allowing various management tasks to be performed in the interactive computer simulation system 1000. The tasks associated with the IOS 1600 allow for control and/or monitoring of one or more ongoing interactive computer simulations. For instance, the IOS 1600 may be used for allowing an instructor to participate to the interactive computer simulation and possibly additional interactive computer simulation(s). In some embodiments, the IOS may be provided by the simulation computing device. In other embodiments, the IOS may be co-located with the simulation computing device (e.g., within the same room or simulation enclosure) or remote therefrom (e.g., in different rooms or in different locations). Skilled persons will understand the many instances of the IOS may be concurrently provided in the interactive computer simulation system 1000. The IOS 1600 may provide a computer simulation management interface, which may be displayed on a dedicated IOS display module 1610 or the GUI module 1150. The IOS 1600 could be located in close proximity with the simulation computing device, but may also be provided outside of the computer system 1100, in communication therewith.

The IOS display module 1610 may comprise one or more display screens such as a wired or wireless flat screen, a wired or wireless touch-sensitive display, a tablet computer, a portable computer or a smart phone. When multiple computing devices 1100 and/or stations 1200, 1300 are present in the computer system 1000, the IOS 1600 may present different views of the computer program management interface (e.g., to manage different aspects therewith) or they may all present the same view thereof. The computer program management interface may be permanently shown on a first of the screens of the IOS display module 1610 while a second of the screen of the IOS display module 1610 shows a view of the interactive computer simulation (i.e., adapted view considering the second screen from images displayed through the display module 1150). The computer program management interface may also be triggered on the IOS 1600, e.g., by a touch gesture and/or an event in the interactive computer program (e.g., milestone reached, unexpected action from the user, or action outside of expected parameters, success or failure of a certain mission, etc.). The computer program management interface may provide access to settings of the interactive computer simulation and/or of the simulation computing device. A virtualized IOS (not shown) may also be provided to the user on the display module 1150 (e.g., on a main screen, on a secondary screen or a dedicated screen thereof). In some embodiments, a Brief and Debrief System (BDS) may also be provided. The BDS may be seen as a version of the IOS used during playback of recorded data only.

The tangible instrument provided by the instrument modules 1160, 1260 and/or 1360 are tightly related to the element being simulated. In the example of the simulated aircraft system, For instance, in relation to an exemplary flight simulator embodiment, the instrument module 1160 may comprise a control yoke and/or side stick, rudder pedals, a throttle, a flap switch, a transponder, a landing gear lever, a parking brake switch, aircraft instruments (air speed indicator, attitude indicator, altimeter, turn coordinator, vertical speed indicator, heading indicator, . . . ), etc. Depending on the type of simulation (e.g., level of immersivity), the tangible instruments may be more or less realistic compared to those that would be available in an actual aircraft. For instance, the tangible instrument provided by the modules 1160, 1260 and/or 1360 may replicate an actual aircraft cockpit where actual instruments found in the actual aircraft or physical interfaces having similar physical characteristics are provided to the user (or trainee). As previously describer, the actions that the user or trainee takes with one or more of the tangible instruments provided via the instrument module (s) 1160, 1260 and/or 1360 (modifying lever positions, activating/deactivating switches, etc.) allow the user or trainee to control the virtual simulated element in the interactive computer simulation. In the context of an immersive simulation being performed in the interactive computer simulation system 1000, the instrument module 1160, 1260 and/or 1360 would typically support a replicate of an actual instrument panel found in the actual system being the subject of the immersive simulation. In such an immersive simulation, the dedicated graphics processing unit 1132 would also typically be required. While the present invention is applicable to immersive simulations (e.g., flight simulators certified for commercial pilot training and/or military pilot training), skilled persons will readily recognize and be able to apply its teachings to other types of interactive computer simulations.

In some embodiment, an optional external input/output (I/O) module 1162 and/or an optional internal input/output (I/O) module 1164 may be provided with the instrument module 1160. Skilled people will understand that any of the instrument modules 1160, 1260 and/or 1360 may be provided with one or both of the I/O modules such as the ones depicted for the computer system 1000. The external input/ output (I/O) module 1162 of the instrument module 1160, 1260 and/or 1360 may connect one or more external tangible instruments (not shown) therethrough. The external I/O module 1162 may be required, for instance, for interfacing the interactive computer simulation system 1000 with one or more tangible instrument identical to an Original Equipment Manufacturer (OEM) part that cannot be integrated into the computer system 1100 and/or the simulation station(s) 1200, 1300 (e.g., a tangible instrument exactly as the one that would be found in the actual system subject of the interactive simulation). The internal input/output (I/O) module 1162 of the instrument module 1160, 1260 and/or 1360 may connect one or more tangible instruments integrated with the instrument module 1160, 1260 and/or 1360. The I/O 1162 may comprise necessary interface(s) to exchange data, set data or get data from such integrated tangible instruments. The internal I/O module 1162 may be required, for instance, for interfacing the interactive computer simulation system 1100 with one or more integrated tangible instrument identical to an Original Equipment Manufacturer (OEM) part (e.g., a tangible instrument exactly as the one that would be found in the actual system subject of the interactive simulation). The I/O 1162 may comprise necessary interface(s) to exchange data, set data or get data from such integrated tangible instruments.

The instrument module 1160 may comprise one or more physical module that may further be interconnected to provide a given configuration of the interactive computer program. As can be readily understood, instruments of the instrument module 1160 are expected to be manipulated by the user of the interactive computer simulation to input commands thereto.

The instrument module 1160 may yet also comprise a mechanical instrument actuator 1166 providing one or more mechanical assemblies for physical moving one or more of the tangible instruments of the instrument module 1160 (e.g., electric motors, mechanical dampeners. gears, levers, etc.). The mechanical instrument actuator 1166 may receive one or more sets of instruments (e.g., from the processor module 1130) for causing one or more of the instruments to move in accordance with a defined input function. The mechanical instrument actuator 1166 of the instrument module 1160 may also alternatively or in addition be used for providing feedback to the user of the interactive computer simulation through tangible and/or simulated instrument(s) (e.g., touch screens, or replicated elements of an aircraft cockpit or of an operating room). Additional feedback devices may be provided with the computing device 1110 or in the computer system 1000 (e.g., vibration of an instrument, physical movement of a seat of the user and/or physical movement of the whole system, etc.).

The simulation computing device may also comprise one or more seats (not shown) or other ergonomically designed tools (not shown) to assist the user of the interactive computer simulation in getting into proper position to gain access to some or all of the instrument module 1160.

In the depicted example of FIG. 1, the computer system 1000 shows optional interactive computer simulation stations 1200, 1300, which may communicate through the network 1400 with the simulation computing device. The stations 1200, 1300 may be associated to the same instance of the interactive computer simulation with a shared computer generated environment where users of the computing devices 1100 and stations 1200, 1300 may interact with one another in a single simulation. The single simulation may also involve other simulation computing device(s) (not shown) co-located with the simulation computing device or remote therefrom. The simulation computing device and stations 1200, 1300 may also be associated to different instances of the interactive computer simulation, which may further involve other simulation computing device(s) (not shown) co-located with the simulation computing device or remote therefrom.

In the context of the depicted embodiments, runtime execution, real-time execution or real-time priority processing execution corresponds to operations executed during the interactive computer simulation that may have an impact on the perceived quality of the interactive computer simulation from a user perspective. An operation performed at runtime, in real-time or using real-time priority processing thus typically needs to meet certain performance constraints that may be expressed, for instance, in terms of maximum time, maximum number of frames, and/or maximum number of processing cycles. For instance, in an interactive simulation having a frame rate of 60 frames per second, it is expected that a modification performed within 5 to 10 frames will appear seamless to the user. Skilled persons will readily recognize that real-time processing may not actually be achievable in absolutely all circumstances in which rendering images is required. The real-time priority processing required for the purpose of the disclosed embodiments relates to perceived quality of service by the user of the interactive computer simulation, and does not require absolute real-time processing of all dynamic events, even if the user was to perceive a certain level of deterioration of quality of service that would still be considered plausible.

A simulation network (e.g., overlaid on the network 1400) may be used, at runtime (e.g., using real-time priority processing or processing priority that the user perceives as real-time), to exchange information (e.g., event-related simulation information). For instance, movements of a vehicle associated to the simulation computing device and events related to interactions of a user of the simulation computing device with the interactive computer generated environment may be shared through the simulation network. Likewise, simulation-wide events (e.g., related to persistent modifications to the interactive computer generated environment, lighting conditions, modified simulated weather, etc.) may be shared through the simulation network from a centralized computer system (not shown). In addition, the storage module 1500 (e.g., a networked database system) accessible to all components of the computer system 1000 involved in the interactive computer simulation may be used to store data necessary for rendering interactive computer generated environment. In some embodiments, the storage module 1500 is only updated from the centralized computer system and the simulation computing device and stations 1200, 1300 only load data therefrom.

Figure 5A:
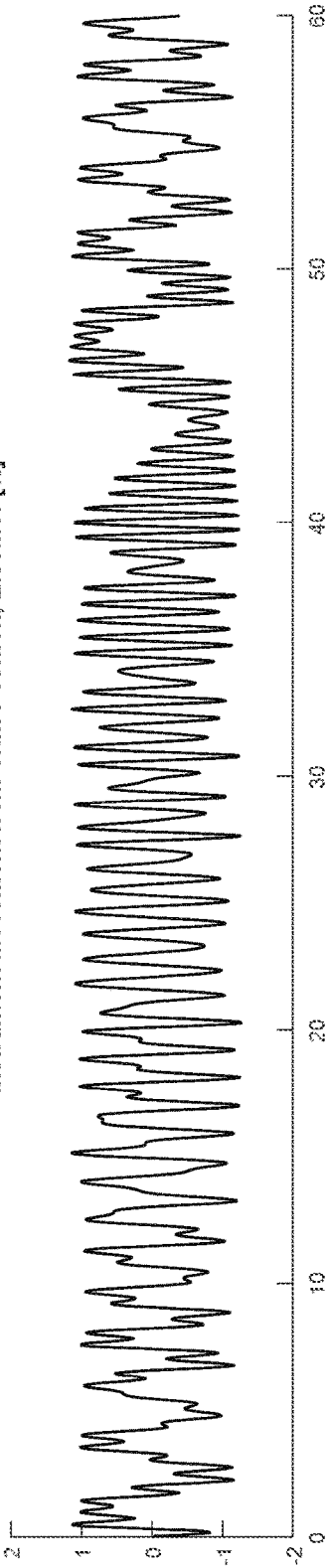
FIG. 5A, FIG. 5B and FIG. 5C, together referred to as FIG. 5, are graphs presenting an exemplary frequency sweep of a trim elevator instrument, in accordance with the teachings of the present invention.
Figure 5B:
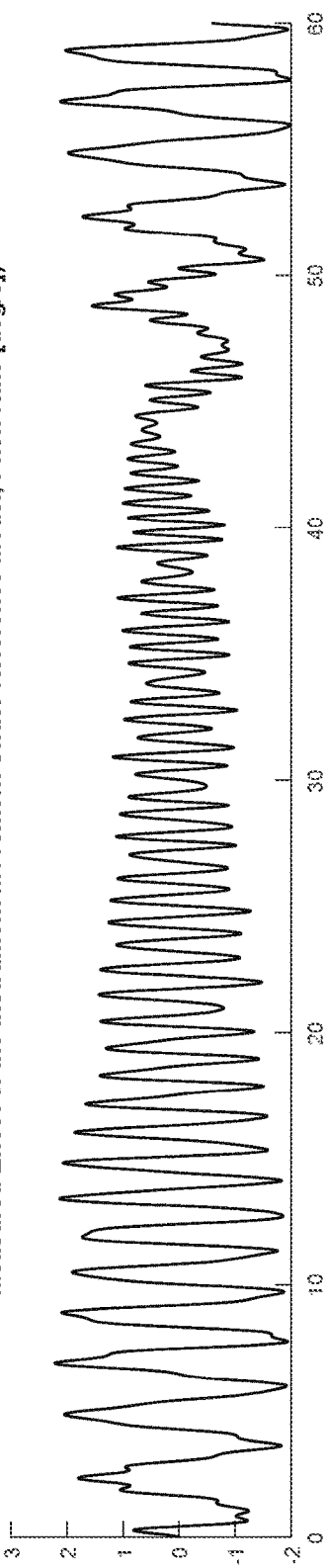
Figure 5C:
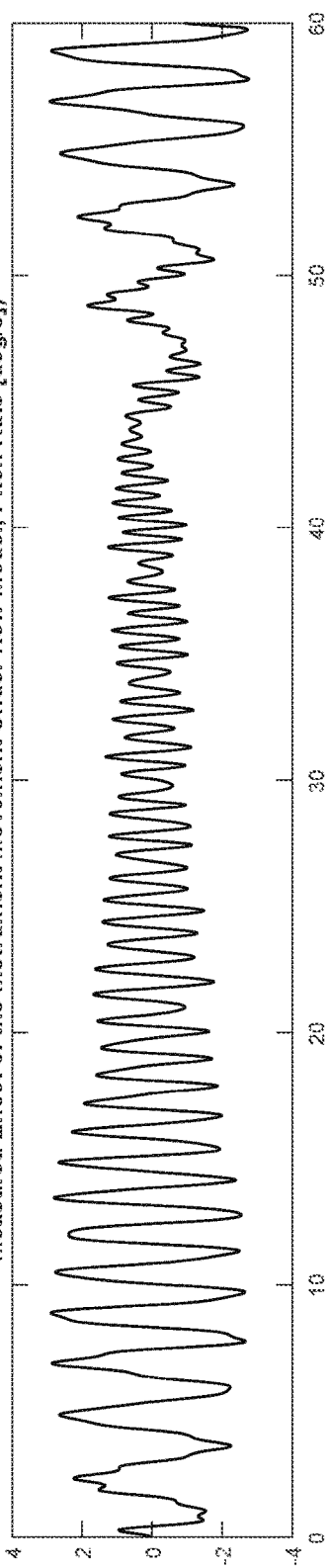

FIGS. 5A, 5B and 5C, together referred to as FIG. 5, show graphs related to a frequency sweep of the trim elevator instrument in a simulated aircraft over a period of time. FIG. 5A shows an input function applied to the trim elevator instrument (i.e., the trim elevator is moved following the input function of FIG. 5A). FIG. 5B shows a measurement of the simulated pitch rate of the simulated aircraft in response to the input function applied to the trim elevator. To obtain the measurements of FIG. 5B, a reference model for the simulated aircraft (e.g., a model that has been previously validated) was used. The measurements therefore represents a baseline measurement for the simulated aircraft under the reference model. FIG. 5C also shows a measurement of the simulated pitch rate of the simulated aircraft in response to the input function applied to the trim elevator. However, to obtain the measurements of FIG. 5B, a new model (e.g., one being developed or updated, one being suspected to be faulty, etc.) for the simulated aircraft (e.g., a model that has not been previously validated) was used. The measurements therefore represents an actual measurement for the simulated aircraft under the new model. As can be appreciated, it is difficult, if not impossible, to determine from the two measurements if the new model affects the dynamic behavior of the simulated aircraft when compared to the reference model.

Figure 6A:
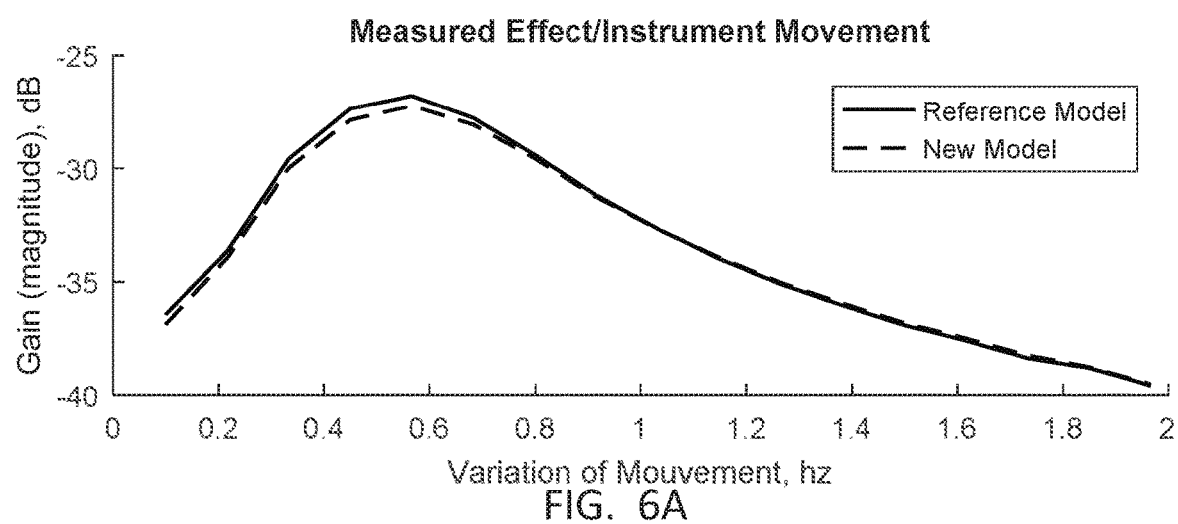
FIG. 6A and FIG. 6B, together referred to as FIG. 6, are graphs presenting the exemplary frequency sweep of FIG. 5 in the frequency domain, in accordance with the teachings of the present invention.
Figure 6B:
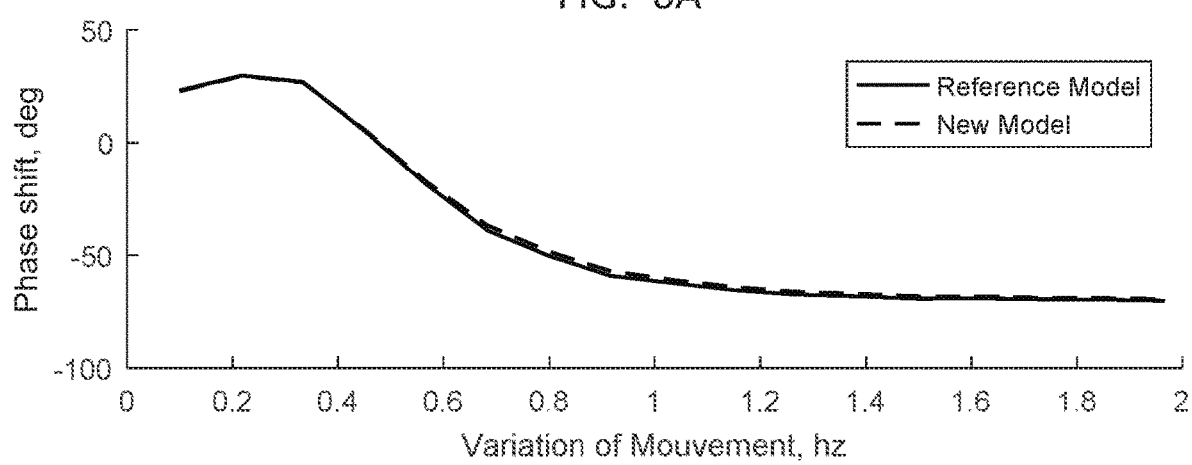

FIG. 6A and FIG. 6B, together referred to as FIG. 6, show graphs related to the frequency sweep of FIG. 5 on the trim elevator instrument in the simulated aircraft over the period of time. FIG. 6 shows the frequency sweep in the frequency domain (i.e., in gain and phase shift) after application of the FFT on the measurement graphs. That is, the frequency response function of the reference model and the frequency response function of the new model can compared. As can be appreciated, one can determine that the new model and the reference model differ by compared their frequency response functions, but it is still difficult to assess the new model affects the dynamic behavior of the simulated aircraft when compared to the reference model.

Figure 7A:
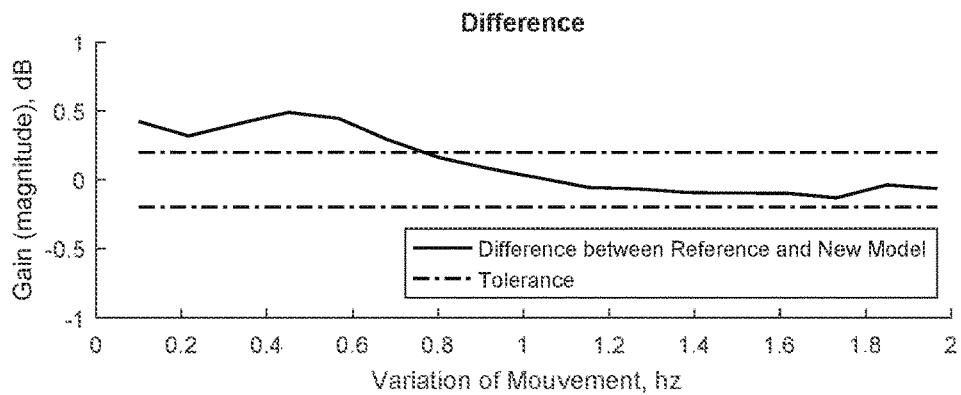
FIG. 7A and FIG. 7B, together referred to as FIG. 7, are graphs presenting a difference between the functions of FIG. 6, in accordance with the teachings of the present invention.
Figure 7B:
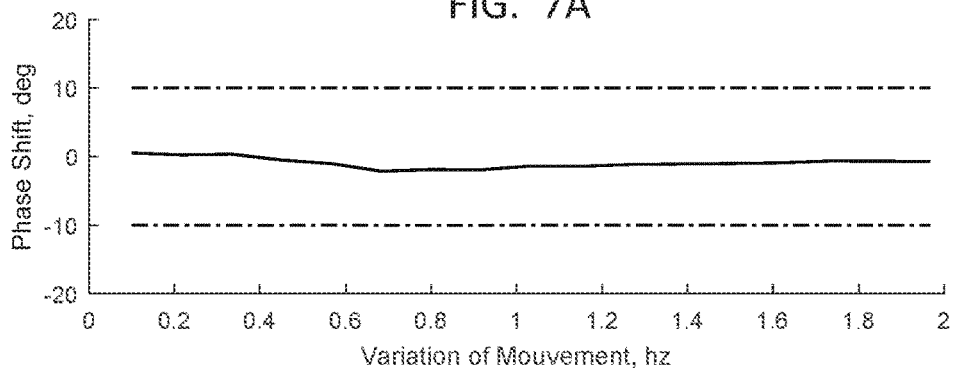
Figure 8A:
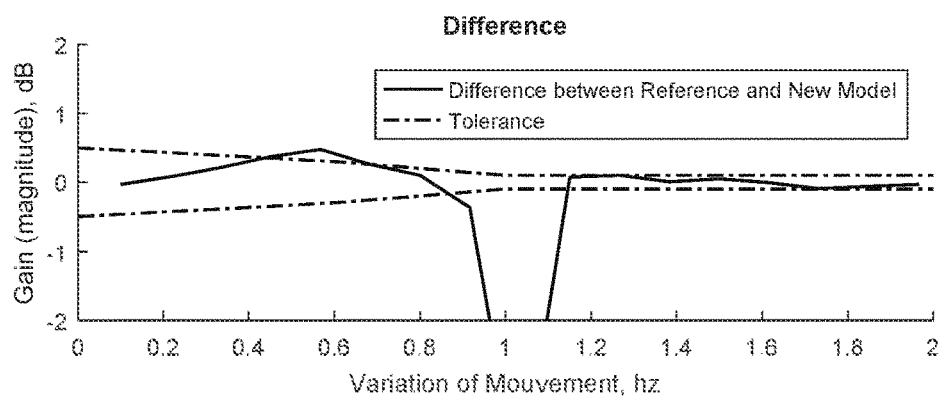
FIG. 8A and FIG. 8B, together referred to as FIG. 8, are graphs presenting a difference between the functions of FIG. 6, in accordance with the teachings of the present invention.
Figure 8B:
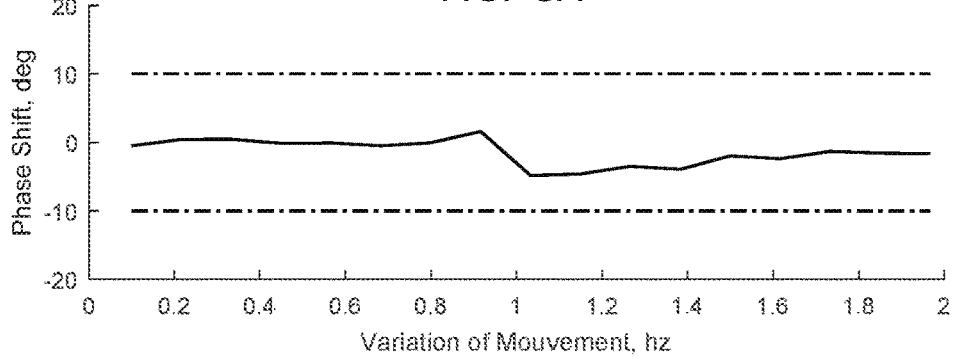

FIG. 7A and FIG. 7B, together referred to as FIG. 7, show graphs related to the frequency response functions of FIG. 6 on the trim elevator instrument presented as the difference between the two measurements. A tolerance band indicating the maximum tolerated variance from the reference model is also displayed (e.g., set for the given measurement and the measured value). As can be appreciated, it is now possible to determine that the new model is improper (e.g., defective/inappropriate . . . ) as the dynamic behavior of the simulated aircraft is outside of the tolerance variation. One could determine that the gain on the pitch rate is improper when the trim elevator is moved between ~0 and ~0.8 Hz.

Going back to FIG. 6, one could determine that the trim elevator instrument affects the pitch rate, measured on a frequency gain, more specifically in a frequency range between ~0.3 Hz and ~0.8 Hz (i.e., frequency of movement in the input function) and affects the pitch rate, measured on a frequency shift, more specifically in a frequency range below ~0.4 Hz and above ~0.6 Hz. One could also provide an input function with a more define frequency signature for a given instrument to better determine the frequency, the frequencies and/or the frequency range(s) affect a given measured value.

Starting from the reference model, it is therefore possible to knowingly modify one of the interrelated parameters of the model and to obtain its measured effect in the frequency realm. By running multiple frequency sweeps for each of the tangible instruments, the potential effect of a given one of the plurality interrelated parameters can therefore be obtained in the frequency realm. By repeating the controlled modification for each of the interrelated parameters (or at least the ones that are identified as interesting or critical), it is possible to "map" the potential effect of each of the plurality of interrelated parameters to one or more frequency or frequency ranges. A corresponding association can also be obtained from the frequency towards the interrelated parameter(s). A frequency response correlation of the model can therefore be established for each one of the tangible instruments. The frequency response correlation may provide association between a given centered frequency of input, for a given one of the tangible instruments, with one or more of the plurality of interrelated parameters of the model. The frequency response correlation may also provide, alternatively or in addition, association of one of the plurality of interrelated parameters of the model with at least one frequency range for the given one of tangible instruments. For instance, the frequency response correlation may identify, for a given instrument (e.g., trim elevator instrument) what parameter(s) of the model have a measured effect on one aspect of the dynamic behavior (e.g., pitch rate) around a certain frequency of input.

For instance, when the simulated interactive object is a simulated aircraft the plurality of interrelated parameters would typically comprise a drag value, a side-force value, a lift value, a pitch value, a roll value, a yaw value and a power profile and a plurality of simulated constraints may be associated to the computer generated environment such as gravitational force and atmospheric pressure. The frequency response correlation may indicate, for the "trim" instrument, that a variation in "pitch rate" gain when the trim is submitted to an input function at a frequency centered between 0.4 Hz and 0.6 Hz can be caused by a modified or ill-configured "pitch value" parameter in the model. The frequency response correlation may also indicate, for the "trim" instrument, that the "power profile" parameter has no measurable effect on "pitch rate" (i.e., is not linked, is not related or is not associated with), no matter how (frequency-wise) the trim is manipulated. Said differently, the frequency response correlation may help determine that the power profile does not have a measurable effect on pitch rate from the perspective of the trim elevator instrument.

In similar manner, a baseline frequency response function may be built by submitting, in for an interactive computer simulation station known to be operating within expected ranges of performance, each of the tangible instruments to complete testing over their respective full range of movement (e.g., frequency range as well as amplitude range). The acceptable and/or expected frequency of movement may vary from one instrument to the other, but may be set on a step function between 0 Hz and 2 Hz (e.g., step of 0.2 HZ each with a 5-second duration). The amplitude of movement will be varied during each step in accordance with the nature and function of the instrument (i.e., a toggle switch or toggle lever does not have the same number of degrees of freedom than an aircraft yoke or rotary selector). One or more measured effect of each of the tangible instruments can then be analyzed from a frequency realm perspective.

Figure 2:
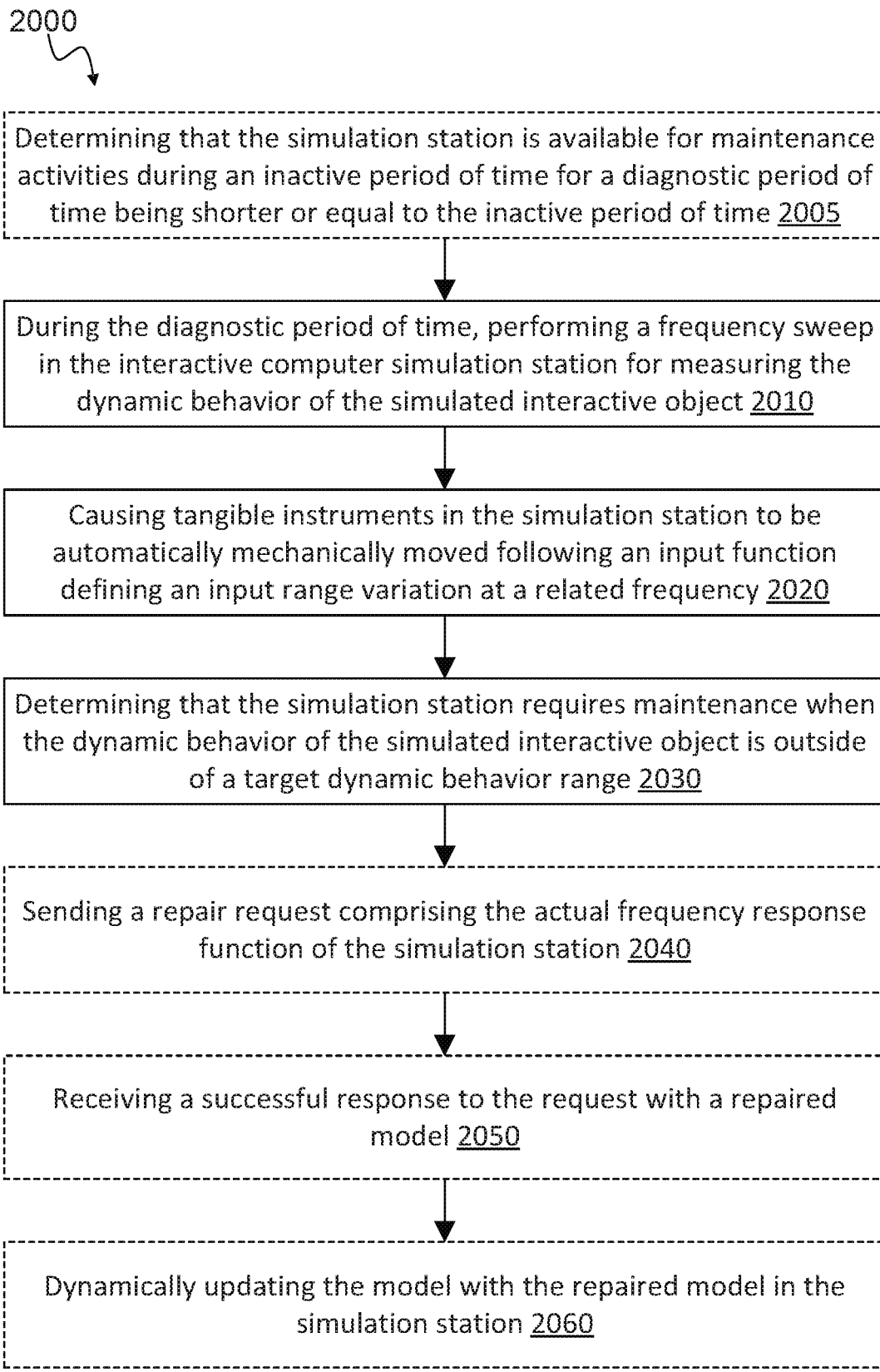
FIG. 2 is a flow chart of a first exemplary method in accordance with the teachings of the present invention.

Reference is now concurrently made to FIGS. 1, 2 and 5 to 8 with reference to a first set of embodiments. FIG. 2 is a flow chart of an exemplary method 2000 for continuous monitoring of a model in an interactive computer simulation station such as the simulation computing device 1100. The model comprises a plurality of interrelated parameters defining a dynamic behavior of a simulated interactive object in an interactive computer simulation when inputs are provided on one or more tangible instruments from the instrument module 1160 of the interactive computer simulation station 1100.

The method 2000 comprises, during a diagnostic period of time of the interactive computer simulation station 1100, performing 2010 a frequency sweep of the model, in the interactive computer simulation station 1100, for measuring the dynamic behavior of the simulated interactive object. Performing 2010 the frequency sweep of the model may involve initiating, continuing and/or completing the frequency sweep as the diagnostic period may or may not be sufficient to perform the complete frequency sweep at once. As such, more than one diagnostic period of times may be necessary to complete the frequency sweep. For instance, in some embodiments, the method 2000 further comprises, planning the frequency sweep for completion over a plurality of disjoint diagnostic periods of time.

The method 2000 also comprises, during the frequency sweep, causing 2020 each of the one or more tangible instruments 1160 in the interactive computer simulation station to be automatically mechanically moved in accordance with an input function defining an input range variation at a related frequency. For instance, the frequency sweep may be performed 2010 by the processor module 1130 sending multiple sets of instructions to the mechanical instrument actuators 1166 to cause 2020 the expected movements. Each set of instructions may provide an input function to be applied to one or more of the instruments of the instrument module 1160. Of course, a single set of instructions may also be used for all of the relevant instruments of the instrument module 1160.

The frequency sweep, upon completion, provides an actual frequency response function for the one or more tangible instruments 1160 defining the dynamic behavior of the simulated interactive object. The frequency response function may be obtained by the processor module 1130 and stored in the memory module 1120 and/or the storage module 1500. Thereafter, the method 2000 continues with determining 2030 that the interactive computer simulation station requires maintenance when the dynamic behavior of the simulated interactive object, measured by the frequency sweep, is outside of a target dynamic behavior range for the simulated interactive object in the interactive computer simulation station 1100. The determination 2030 may be performed by the processor module 1130 using the memory module 1220.

In some embodiments, the diagnostic period of time fits into an inactive period of time and the method 2000 may therefore further comprise determining 2005 that the interactive computer simulation station 1100 is available for maintenance. For instance, the interactive computer simulation station 1100 may be available for non-invasive maintenance activities during the inactive period of time and the diagnostic period of time may be set to be shorter or equal to the inactive period of time. Of course, skilled persons will recognize that the diagnostic period of time may be a dedicated period of time. However, by using the inactive periods of time, the usable time of the interactive computer simulation station 1100 may be optimized. For instance, inactive periods of time may correspond to an unreserved period of time (e.g., no trainee assigned for a given time), a change of training crew (e.g., between two training sessions), a debriefing period during which the interactive computer simulation station 1100 is unoccupied but still reserved, etc.

Outside of the diagnostic period of time, the method 2000 may further comprise running the interactive computer simulation at the interactive computer simulation station comprising a display module and, in real-time (or in real-time priority processing) by the processing module 1130 during the interactive computer simulation, monitoring the one or more tangible instruments for user inputs causing a simulated behavior of the simulated interactive object considering the model associated thereto. Images from the interactive computer simulation are shown on at least one display screen of the display module in relation to the simulated behavior (e.g., using the dedicated graphics unit 1132 for rendering the images).

In some embodiments, the method 2000 further comprises defining a frequency response correlation of the model for a given one of tangible instruments. The frequency response correlation may provide association of a given centered frequency for the given one of tangible instruments with one or more of the plurality of parameters of the model. The frequency response correlation may also provide, alternatively or in addition, association of one of the plurality of parameters of the model with at least one frequency range for the given one of tangible instruments. The frequency response correlation identifies, for a given instrument (e.g., trim) what parameter(s) of the model have a measured effect on one aspect of the dynamic behavior (e.g., pitch rate) around a certain frequency.

The method 2000 may also further comprise obtaining a baseline frequency response function between each of the plurality of interrelated parameters of the model and each of the one or more tangible instruments.

The method 2000 may also comprise identifying one or more discrepancy measurements between the baseline frequency response function and the actual frequency response function. Each discrepancy measurement being centered on at least one frequency. At least one target parameter is then identified from the plurality of interrelated parameters as possibly causing the discrepancy measurement with reference to the frequency response correlation. That is, when the discrepancy is identified around a certain centered frequency, the frequency response correlation may be used to identify all "target" parameters that are known to potentially affect the corresponding measurement.

The method 2000 may also comprise upon determining 2030 that the interactive computer simulation station requires maintenance, sending 2040 a repair request comprising the actual frequency response function. A response to the request may be received 2050 with a repaired model and the model may be dynamically updated 2060 with the repaired model in the interactive computer simulation station.

Figure 3:
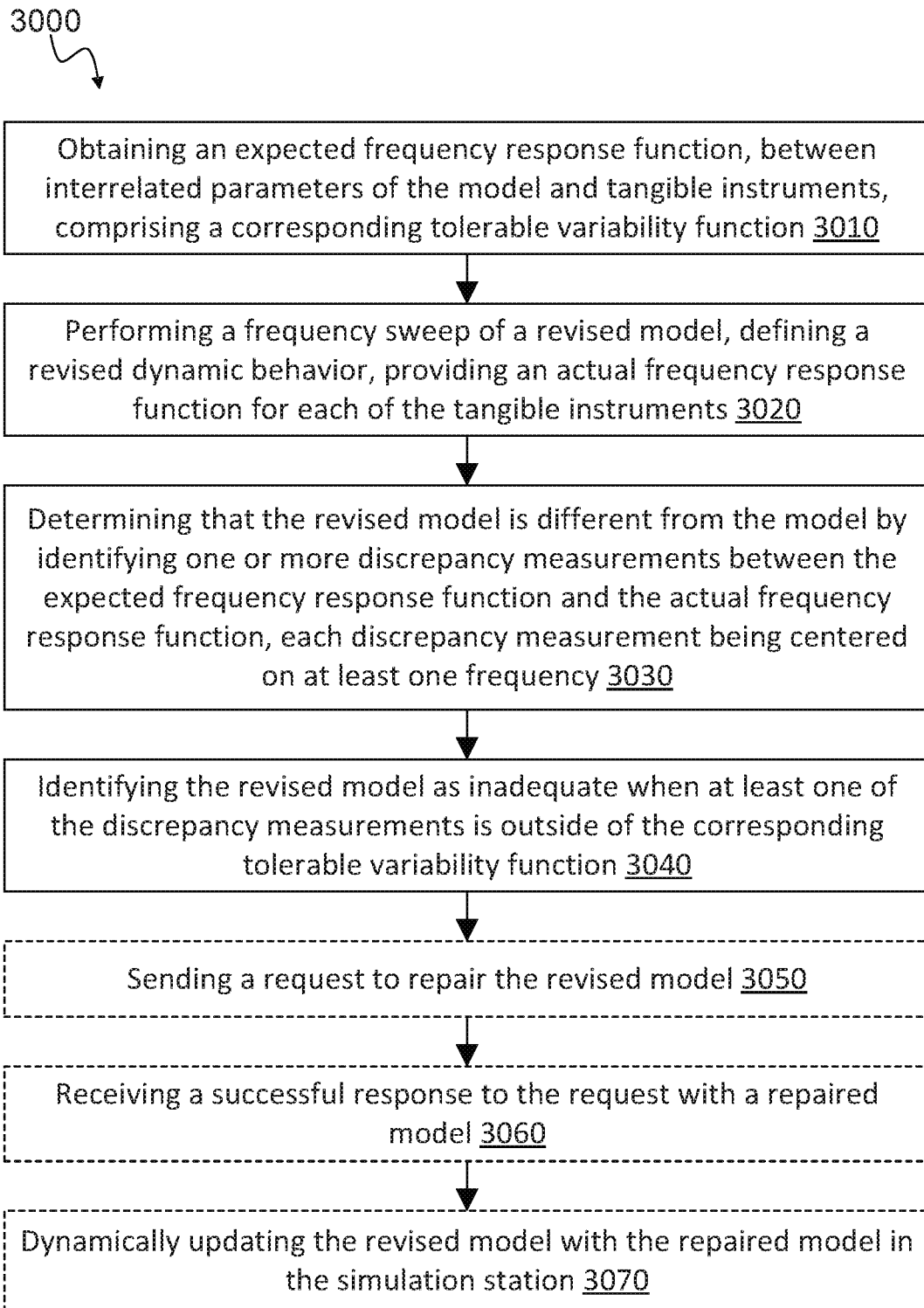
FIG. 3 is a flow chart of a second exemplary method in accordance with the teachings of the present invention.

Reference is now concurrently made to FIGS. 1, 3 and 5 to 8 with reference to a second set of embodiments. It should be noted that the first set of embodiments and the second set of embodiments, while providing standalone solutions, are not mutually exclusive. FIG. 3 is a flow chart of an exemplary method 3000 for troubleshooting a model comprising a plurality of interrelated parameters defining a dynamic behavior of a simulated interactive object. In an interactive computer simulation, when inputs are provided on one or more tangible instruments 1160 of an interactive computer simulation station 1100, the simulated object exhibits the dynamic behavior in relation to the model. The method 3000 may be useful, for instance, when designing or modifying the model into a revised model of the simulated object (e.g., using the processor module 1130 or another computer system) or when one needs to assess whether a different (or revised) model is proper. Basically, one may want to determine that the revised model does not create unwanted effects that would otherwise be difficult to detect.

The method 3000 comprises obtaining 3010 an expected frequency response function between each of the plurality of interrelated parameters of the model (e.g., original or base) and each of the one or more tangible instruments 1160 ((e.g., using the processing module 1130 and/or obtaining 4010 the expected frequency response function from the memory module 1120, the network interface module 1140 and/or the storage module 1500). The expected frequency response function comprises a corresponding tolerable variability function. The method 3000 also comprises performing 3020 a frequency sweep of the revised model (e.g., using the processor module 1130), defining a revised dynamic behavior of the simulated interactive object, providing an actual frequency response function for each of the one or more tangible instruments 1160. The method 3000 then comprises determining 3030 that the revised model is different from the model by identifying one or more discrepancy measurements between the expected frequency response function and the actual frequency response function (e.g., using the processor module 1130). Each discrepancy measurement is centered on at least one frequency. From the discrepancies, the method 3000 continues with identifying 3040 the revised model as inadequate when at least one of the one or more discrepancy measurements is outside of the corresponding tolerable variability function.

As previously discussed with reference to other examples, the method 3000 may comprise defining a frequency response correlation of the model for a given one of tangible instruments (e.g., using the processor module 1130). The frequency response correlation may provide an association of a given centered frequency for the given one of tangible instruments with one or more of the plurality of parameters of the model and/or may provide an association of one of the plurality of parameters of the model with at least one frequency range for the given one of tangible instruments. The method 3000 may therefore also comprise identifying at least one target parameter from the plurality of interrelated parameters causing the discrepancy measurement with reference to the frequency response correlation (e.g., using the processor module 1130).

When the simulated interactive object is a simulated aircraft, the plurality of interrelated parameters may comprise a drag value, a side-force value, a lift value, a pitch value, a roll value, a yaw value and a power profile and a plurality of simulated constraints may be associated to the computer generated environment such as gravitational force and atmospheric pressure.

In some embodiments, the frequency sweep of the revised model is performed using the processor module 1130 or another computing device in the context of designing the revised model for the simulated interactive object in the interactive computer simulation station. For instance, a new identifiable version of the simulated interactive object may have a slightly different model and be based on a prior version.

The frequency sweep of the revised model may also, alternatively or in addition, be performed in the context of maintenance of the interactive computer simulation station 1100. In that exemplary scenario, the method 3000 may also comprise sending 3050 a request to repair the revised model comprising the actual frequency response function. The method 3000 may then also comprise receiving 3060 a successful response to the request with a repaired model and dynamically updating the revised model with the repaired model.

Figure 4:
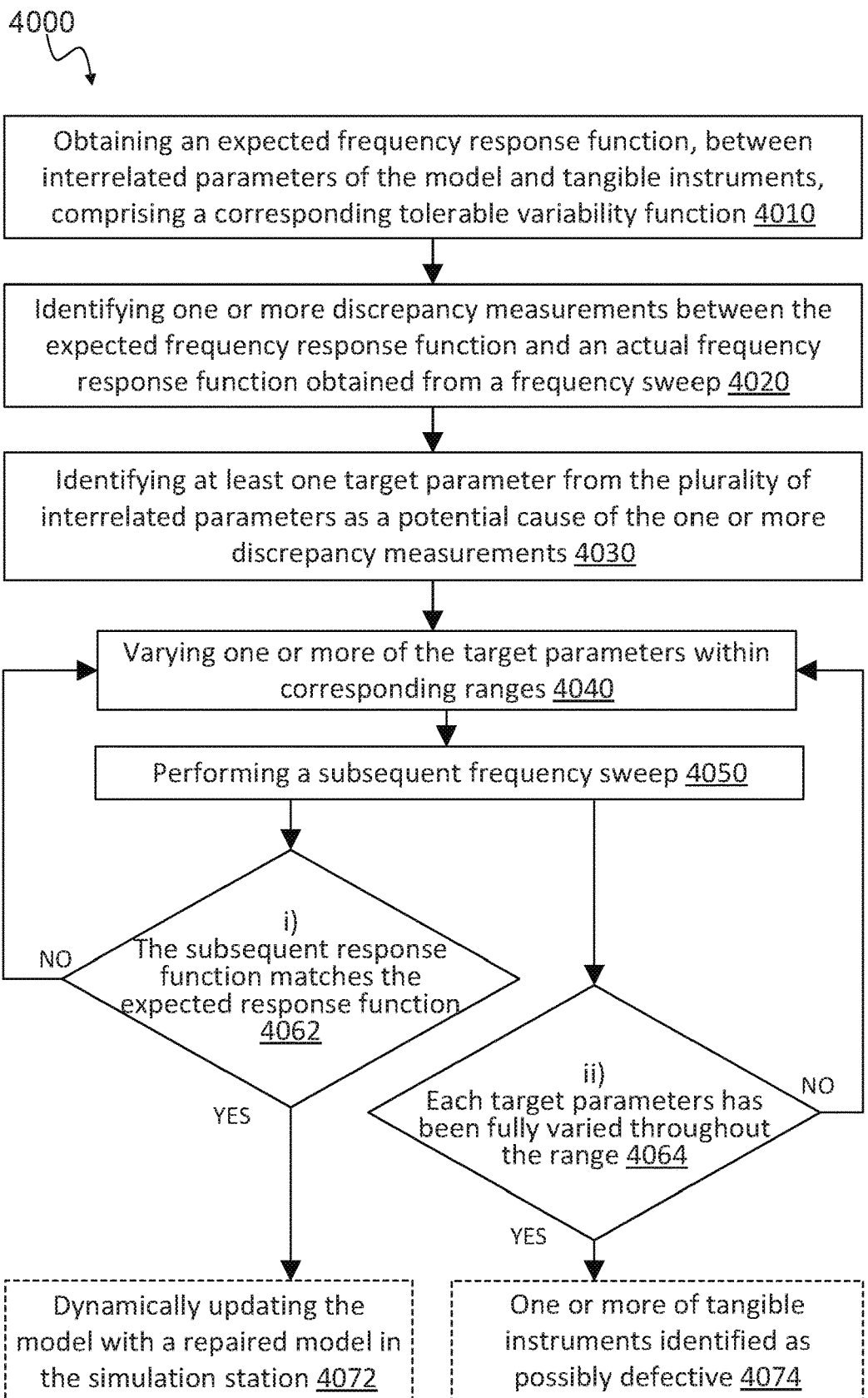
FIG. 4 is a flow chart of a third exemplary method in accordance with the teachings of the present invention.

Reference is now concurrently made to FIGS. 1, 4 and 5 to 8 with reference to a third set of embodiments. It should be noted that the first set of embodiments, the second set of embodiments and the third set of embodiments, while providing standalone solutions, are not mutually exclusive. FIG. 4 is a flow chart of an exemplary method 4000 for repairing a model comprising a plurality of interrelated parameters defining a dynamic behavior of a simulated interactive object in an interactive computer simulation. In an interactive computer simulation, when inputs are provided on one or more tangible instruments 1160 of an interactive computer simulation station 1100, the simulated object exhibits the dynamic behavior in relation to the model. The method 4000 may be useful, for instance, when designing or modifying the model into a revised model of the simulated object (e.g., using the processor module 1130 or another computer system) to provide a working model, when one needs to ensure that a different (or revised) model is proper and/or when one wants to rule out the possibility that the model is defective (i.e., confirm that one or more of the tangible instruments required maintenance).

The method 4000 comprises obtaining 4010 an expected frequency response function, for the simulated interactive object, between each of the plurality of interrelated parameters of the model and each of the one or more tangible instruments (e.g., using the processing module 1130 and/or obtaining 4010 the expected frequency response function from the memory module 1120, the network interface module 1140 and/or the storage module 1500). The method 4000 then continues with identifying 4020 one or more discrepancy measurements between the expected frequency response function and an actual frequency response function obtained from a frequency sweep of the model (e.g., using the processor module 1130) and identifying 4030 at least one target parameter from the plurality of interrelated parameters as a potential cause of the one or more discrepancy measurements (e.g., using the processor module 1130). The method 4000 then attempts to repair at least one of the target parameters dynamically and iteratively. To that effect, the method comprises varying 4040 one or more of the at least one target parameter within the one or more corresponding ranges (e.g., using the processor module 1130) and thereafter performing 4050 a subsequent frequency sweep providing a subsequent frequency response function (e.g., using the processor module 1130). The varying 4040 and the performing 4050 are repeated until either i) 4062 the subsequent frequency response function from the subsequent frequency sweep matches the expected frequency response function or ii) 4064 each of the at least one target parameter has been fully varied throughout a corresponding range. in some embodiments, the expected frequency response function comprises a corresponding tolerable variability function and the subsequent frequency sweep is evaluated against the expected frequency response function in i) considering the tolerable variability function for determining when there is a match therebetween.

In some embodiments, when ii) 4064 occurs, the method 4000 may identify 4074 one or more of the tangible instruments as possibly defective (e.g., requiring maintenance).

In some embodiments, when i) 4062 occurs, the method 4000 comprise selectively and dynamically updating 4064 the model associated to the simulated interactive object with a repaired model e.g., using the processor module 1130). When the method 4000 is performed in the interactive computer simulation station 1100, the method 4000 may then comprise running the interactive computer simulation at the interactive computer simulation station comprising a display module and, in real-time during the interactive computer simulation (or at least partly in real-time priority processing), monitoring the one or more tangible instruments 1160 for user inputs causing a simulated behavior of the simulated interactive object considering the repaired model associated thereto. Images from the interactive computer simulation may then be rendered (e.g., by the dedicated graphics unit 1132) and shown on at least one display screen of a graphical user interface module 1150 in relation to the simulated behavior.

The method 4000 may also comprise, as previously explained, defining a frequency response correlation of the model for a given one of the tangible instruments, wherein the frequency response correlation provides at least one of association of a given frequency for the given one tangible instrument with one or more of the plurality of parameters of the model and association of one of the plurality of parameters of the model with at least one frequency range for the given one tangible instrument. The method 4000 may therefor identify 4030 the at least one target parameter is performed using at least one centered frequency for the discrepancy measurements in relation to the frequency response correlation.

The simulated interactive object may be a simulated aircraft and the plurality of interrelated parameters may then comprise a drag value, a side-force value, a lift value, a pitch value, a roll value, a yaw value and a power profile and a plurality of simulated constraints may be associated to the computer generated environment such as gravitational force and atmospheric pressure.

The method 4000, in some embodiments, comprises receiving a request to repair the model (e.g., through the network interface module 1140) comprising the actual frequency response function and upon i), dynamically updating 4072 the model into a repaired model and sending a successful response to the request (e.g., through the network interface module 1140 to the network address of the requestor). The request may comprise a model identification request and the request may also comprises an identifiable version of the simulated interactive object. Receiving the request may be performed in the context of maintenance of the interactive computer simulation station.

A method is generally conceived to be a self-consistent sequence of steps leading to a desired result. These steps require physical manipulations of physical quantities. Usually, though not necessarily, these quantities take the form of electrical or magnetic/electromagnetic signals capable of being stored, transferred, combined, compared, and otherwise manipulated. It is convenient at times, principally for reasons of common usage, to refer to these signals as bits, values, parameters, items, elements, objects, symbols, characters, terms, numbers, or the like. It should be noted, however, that all of these terms and similar terms are to be associated with the appropriate physical quantities and are merely convenient labels applied to these quantities.

The description of the present invention has been presented for purposes of illustration but is not intended to be exhaustive or limited to the disclosed embodiments. Many modifications and variations will be apparent to those of ordinary skill in the art. The embodiments were chosen to explain the principles of the invention and its practical applications and to enable others of ordinary skill in the art to understand the invention in order to implement various embodiments with various modifications as might be suited to other contemplated uses.

What is claimed is:

1. A method for troubleshooting a model, comprising a plurality of interrelated parameters, the model defining a dynamic behavior of a simulated interactive object in an interactive computer simulation in response to inputs provided on a tangible instrument of an interactive computer simulation station, the method comprising:
   automatically mechanically moving the tangible instrument in the interactive computer simulation station in accordance with an input function defining an input range variation at each one of a plurality of frequencies, to perform a frequency sweep of the model to determine a frequency response function;
   comparing an expected frequency response function and the determined frequency response function to identify a discrepancy measurement between the expected frequency response function and the determined frequency response function, wherein the expected frequency response function is obtained by moving the tangible instrument in accordance with the input function to perform a frequency sweep of a known operational model, and wherein the expected frequency response function comprises a corresponding tolerable variability function associated therewith that defines a maximum tolerated variance from the expected frequency response; and
   identifying the model as inadequate and requiring troubleshooting when the discrepancy measurement exceeds the maximum tolerated variance.

2. The method of claim 1 further comprising:
   defining a frequency response correlation of the model for the tangible instrument, wherein the frequency response correlation provides at least one of:
      an association of a given centered frequency for the tangible instrument with one or more of the plurality of interrelated parameters of the model; and
      an association of one of the plurality of interrelated parameters of the model with at least one frequency range for the tangible instrument; and
   identifying at least one target parameter from the plurality of interrelated parameters causing the discrepancy measurement based on the frequency response correlation.

3. The method of claim 1, wherein the simulated interactive object is a simulated aircraft, wherein:
   the plurality of interrelated parameters comprises:
      a drag value, a side-force value, a lift value, a pitch value, a roll value, a yaw value and a power profile; and
   a plurality of simulated constraints associated to a computer-generated environment in the interactive computer simulation and affecting the dynamic behavior of the simulated interactive object comprises gravitational force and atmospheric pressure.

4. The method of claim 2, wherein the frequency sweep of the model is performed in the context of maintenance of the interactive computer simulation station, and the method further comprises:

for each target parameter of the at least one target parameter:
varying the target parameter within a corresponding range;
performing a subsequent frequency sweep of the model to determine a subsequent frequency response function; and
comparing the expected frequency response function and the subsequent frequency response function to determine whether the varying of the target parameter results in the subsequent frequency response function matching the expected frequency response function;
wherein it is determined that the tangible instrument requires maintenance when no subsequent frequency response function matches the expected frequency response function.

5. A computer system for troubleshooting a model, comprising a plurality of interrelated parameters, the model defining a dynamic behavior of a simulated interactive object in an interactive computer simulation in response to inputs provided on a tangible instrument of an interactive computer simulation station, the computer system comprising:

a processing module; and:
a computer-readable memory storing instructions which, when read by the processing module, configure the processing module to perform the steps of:
automatically mechanically moving the tangible instrument in the interactive computer simulation station in accordance with an input function defining an input range variation at each one of a plurality of frequencies, to perform a frequency sweep of the model to determine a frequency response function;
comparing an expected frequency response function and the determined frequency response function to identify a discrepancy measurement between the expected frequency response function and the determined frequency response function, wherein the expected frequency response function is obtained by moving the tangible instrument in accordance with the input function to perform a frequency sweep of a known operational model, and wherein the expected frequency response function comprises a corresponding tolerable variability function associated therewith that defines a maximum tolerated variance from the expected frequency response; and
identifying the model as inadequate and requiring troubleshooting when the discrepancy measurement exceeds the maximum tolerated variance.

6. The computer system of claim 5, wherein the instructions, when executed by the processing module, further cause the processing module to define a frequency response correlation of the model for the tangible instrument, wherein the frequency response correlation provides at least one of:
an association of a given centered frequency for the tangible instrument with one or more of the plurality of interrelated parameters of the model; and
an association of one of the plurality of interrelated parameters of the model with at least one frequency range for the tangible instrument; and
wherein the instructions, when executed by the processing module, further cause the processing module to identify at least one target parameter from the plurality of interrelated parameters causing the discrepancy measurement based on the frequency response correlation.

7. The computer system of claim 5, wherein the simulated interactive object is a simulated aircraft, wherein the plurality of interrelated parameters comprises a drag value, a side-force value, a lift value, a pitch value, a roll value, a yaw value and a power profile; and wherein a plurality of simulated constraints associated to a computer-generated environment in the interactive computer simulation and affecting the dynamic behavior of the simulated interactive object comprises gravitational force and atmospheric pressure.

8. The computer system of claim 6, wherein the frequency sweep of the model is performed in the context of designing a revised model for the simulated interactive object in the interactive computer simulation station, and the processing module is configured to:
send a request to repair the model comprising the determined frequency response function, wherein repairing the model comprises repairing the at least one target parameter identified as causing the discrepancy measurement.

9. The computer system of claim 6, wherein the frequency sweep of the model is performed in the context of maintenance of the interactive computer simulation station, and the processing module is configured to:
for each target parameter of the at least one target parameter:
vary the target parameter within a corresponding range;
perform a subsequent frequency sweep of the model to determine a subsequent frequency response function; and
compare the expected frequency response function and the subsequent frequency response function to determine whether the varying of the target parameter results in the subsequent frequency response function matching the expected frequency response function;
wherein it is determined that the tangible instrument requires maintenance when no subsequent frequency response function matches the expected frequency response function.

10. The computer system of claim 8, wherein the instructions, when executed by the processing module, further cause the processing module to dynamically update the model with the repaired at least one target parameter.

11. A non-transitory computer-readable medium having computer-readable instructions stored thereon, which, when executed by a processor of a computer system, configures the computer system to perform a method for troubleshooting a model, comprising a plurality of interrelated parameters, the model defining a dynamic behavior of a simulated interactive object in an interactive computer simulation in response to inputs provided on a tangible instrument of an interactive computer simulation station, the method comprising:
automatically mechanically moving the tangible instrument in the interactive computer simulation station in accordance with an input function defining an input range variation at each one of a plurality of frequencies, to perform a frequency sweep of the model to determine a frequency response function;
comparing an expected frequency response function and the determined frequency response function to identify a discrepancy measurement between the expected frequency response function and the determined frequency response function, wherein the expected frequency response function is obtained by moving the tangible instrument in accordance with the input function to perform a frequency sweep of a known operational model, and wherein the expected frequency response function comprises a corresponding tolerable variability function associated therewith that defines a maximum tolerated variance from the expected frequency response; and identifying the model as inadequate and requiring troubleshooting when the discrepancy measurement exceeds the maximum tolerated variance.

12. The non-transitory computer-readable medium of claim 11, wherein the method further comprises:

defining a frequency response correlation of the model for the tangible instrument a, wherein the frequency response correlation provides at least one of:

an association of a given centered frequency for the tangible instrument with one or more of the plurality of interrelated parameters of the model; and an association of one of the plurality of interrelated parameters of the model with at least one frequency range for the tangible instrument; and identifying at least one target parameter from the plurality of interrelated parameters causing the discrepancy measurement based on the frequency response correlation.

13. The non-transitory computer-readable medium of claim 11, wherein the simulated interactive object is a simulated aircraft, wherein:

the plurality of interrelated parameters comprises: a drag value, a side-force value, a lift value, a pitch value, a roll value, a yaw value and a power profile; and a plurality of simulated constraints associated to a computer-generated environment in the interactive computer simulation and affecting the dynamic behavior of the simulated interactive object comprises gravitational force and atmospheric pressure.

14. The non-transitory computer-readable medium of claim 12, wherein the frequency sweep of the model is performed in the context of designing a revised model for the simulated interactive object in the interactive computer simulation station, and the method further comprises:

sending a request to repair the model comprising the determined frequency response function, wherein repairing the model comprises repairing the at least one target parameter identified as causing the discrepancy measurement.

15. The non-transitory computer-readable medium of claim 12, wherein the frequency sweep of the model is performed in the context of maintenance of the interactive computer simulation station, and the method further comprises:

for each target parameter of the at least one target parameter:

varying the target parameter within a corresponding range;

performing a subsequent frequency sweep of the model to determine a subsequent frequency response function; and comparing the expected frequency response function and the subsequent frequency response function to determine whether the varying of the target parameter results in the subsequent frequency response function matching the expected frequency response function;

wherein it is determined that the tangible instrument requires maintenance when no subsequent frequency response function matches the expected frequency response function.

16. The non-transitory computer-readable medium of claim 14, wherein the method further comprises:

dynamically updating the model with the repaired at least one target parameter.

17. A method of generating a new version of a model, the model comprising a plurality of interrelated parameters, the model defining a dynamic behavior of a simulated interactive object in an interactive computer simulation in response to inputs provided on a tangible instrument of an interactive computer simulation station, the method comprising:

automatically mechanically moving the tangible instrument in the interactive computer simulation station in accordance with an input function defining an input range variation at each one of a plurality of frequencies, to perform a frequency sweep of the model to determine a frequency response function;

comparing an expected frequency response function and the determined frequency response function to identify a discrepancy measurement between the expected frequency response function and the determined frequency response function, wherein the expected frequency response function is obtained by moving the tangible instrument in accordance with the input function to perform a frequency sweep of a known operational model, and wherein the expected frequency response function comprises a corresponding tolerable variability function associated therewith that defines a maximum tolerated variance from the expected frequency response;

identifying the model as inadequate and requiring a new version of the model when the discrepancy measurement exceeds the maximum tolerated variance;

defining a frequency response correlation of the model for the tangible instrument, wherein the frequency response correlation provides at least one of:

an association of a given centered frequency for the tangible instrument with one or more of the plurality of interrelated parameters of the model; and an association of one of the plurality of interrelated parameters of the model with at least one frequency range for the tangible instrument;

identifying at least one target parameter from the plurality of interrelated parameters causing the discrepancy measurement based on the frequency response correlation; and adjusting the target parameter, thereby generating the new version of the model.

* * * * *